(12) United States Patent
Wang et al.

(10) Patent No.: US 7,554,423 B2
(45) Date of Patent: Jun. 30, 2009

(54) CANCELLATION OF INDUCTOR WINDING CAPACITANCE

(75) Inventors: Shuo Wang, Blacksburg, VA (US); Fred C. Lee, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 48 days.

(21) Appl. No.: 11/552,292

(22) Filed: Oct. 24, 2006

(65) Prior Publication Data

US 2008/0094153 A1    Apr. 24, 2008

(51) Int. Cl.
*H03H 7/00*    (2006.01)
*H01F 27/28*    (2006.01)

(52) U.S. Cl. .................................... 333/185; 336/229
(58) Field of Classification Search ................ 333/185, 333/181, 12; 336/188, 229
See application file for complete search history.

(56) References Cited

U.S. PATENT DOCUMENTS 3,731,234 A * 5/1973 Collins ........................... 333/1

3,748,581 A * 7/1973 Yello ........................... 455/144
6,507,176 B2 * 1/2003 Wittenbreder, Jr. .......... 323/259

OTHER PUBLICATIONS

Wang et al., Design of Inductor Winding Capacitance Cancellation for Suppression, Power Electronics Specialists Conference, 2006. PESC'06.37, Jun. 22, 2006, 7 pages.*

* cited by examiner

*Primary Examiner*—Dean O Takaoka
(74) *Attorney, Agent, or Firm*—Whitham, Curtis, Christofferson & Cook, P.C.

(57) ABSTRACT

An inductor device or filter such as an electromagnetic interference (EMI) filter which includes an inductor provides cancellation of parasitic capacitance of the inductor and extends high frequency performance of the inductor or filter by providing the inductor using split windings and including capacitors to couple signals corresponding to those which are passed by the equivalent parallel capacitance of the inductor to another split winding or an inductor in the ground return path. Cancellation of parasitic capacitance is provided for differential mode and common mode split windings where the split windings may be either inductively coupled or not. Forming the split windings as a bifilar winding to increase coupling coefficient further improves performance and allows cancellation (as distinct from parasitic capacitance reduction) and avoidance of resonance in circuits in which an inductor is not permitted in the ground return path.

20 Claims, 10 Drawing Sheets

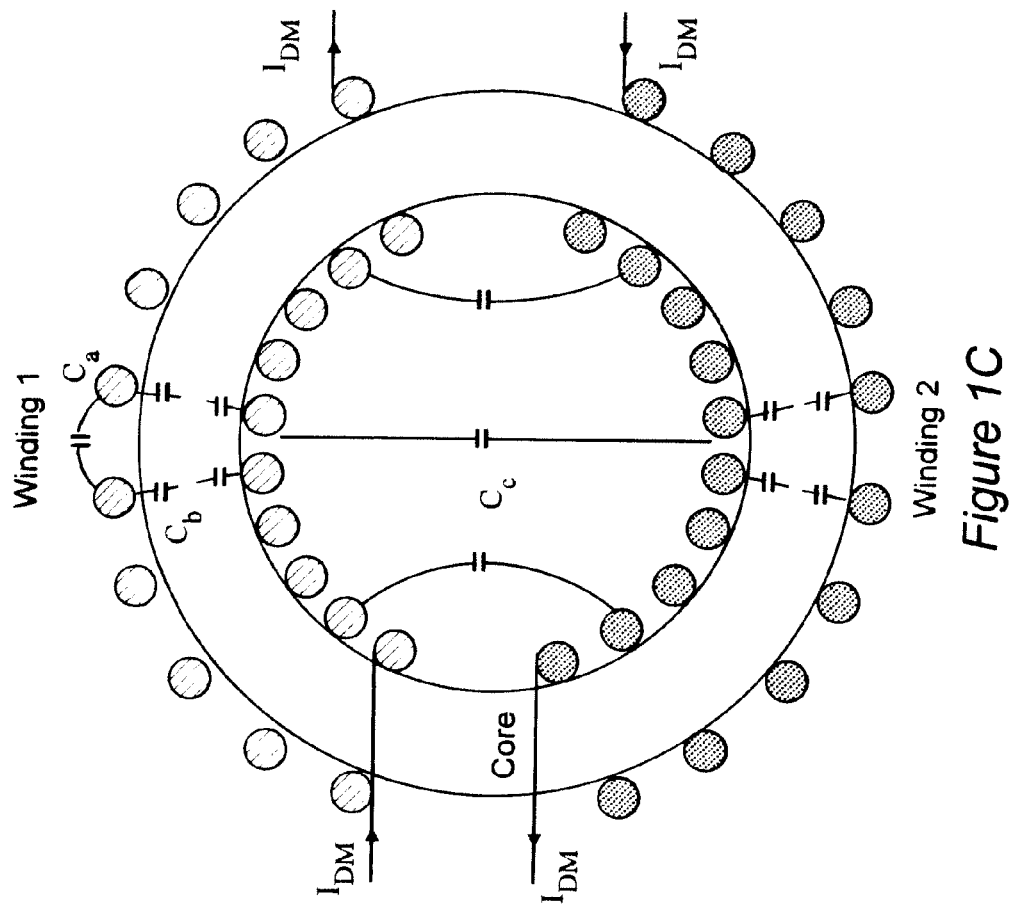

CANCELLATION OF INDUCTOR WINDING CAPACITANCE

STATEMENT OF GOVERNMENT INTEREST

The present invention was made in connection with National Science Foundation grant EEC 9731677. Therefore, the U.S. Government may have certain rights in this invention.

BACKGROUND OF THE INVENTION

1. Field of the Invention

The present invention generally relates to electrical inductors, principally in filter applications, and, more particularly, to the improvement of performance of filter inductors at high frequencies.

2. Description of the Prior Art

Resistance, capacitance and inductance are three fundamental electrical properties which are exhibited to a greater or lesser degree by any structure capable of carrying a current. Electrical elements are often identified by one of these properties which is dominant in the electrical behavior of that element although the element may also exhibit parasitic properties which may be significant or even dominant under particular conditions. An inductor is thus a basic and fundamental electrical element which is constructed to develop a voltage across it which opposes a change in current through it; a function generally achieved by one or more coils of a conductor, referred to as a winding. Thus, inductors are often employed as series filter elements and in resonant circuits. Power supplies and electro-magnetic interference (EMI) suppression filters are examples of types of circuits in which the use of inductors is common.

As alluded to above, however, all practical embodiments of electrical devices, regardless of the characteristic intended to be dominant, will exhibit some other parasitic characteristics to some degree. The degree to which such parasitic characteristics are reduced in a given device, generally by careful control of structural dimensions and materials, is generally a primary indicator of the quality thereof. In inductors, a principal parasitic characteristic is referred to as the equivalent parallel winding capacitance or, simply, equivalent parallel capacitance (EPC) which can be modeled as a small capacitor connected in parallel with a winding of the inductor. Any practical inductor will also exhibit an equivalent parallel resistance (EPR) which can be modeled as a similar connection of a resistor in parallel with the inductor.

Unfortunately, such a parasitic capacitance provides substantially the opposite effect as that desired from an inductor and such effect increases with increase of frequency; often encountered in current circuit designs such as microprocessors. Specifically, for an ideal inductor having inductance L, the impedance at a frequency, f, is given by the equation $$Z_L = j2\Pi f L$$

which thus increases with increasing frequency. However, the EPC between turns and between each turn and between respective windings of a practical inductor at very high frequencies where the EPC dominates the effect of the inductance, the impedance thus becomes $$Z_L = 1/j2\Pi f(EPC)$$

which decreases with increasing frequency and may therefore severely compromise the desired and intended filter and/or protective function of the inductor by providing a low impedance parallel path for high frequency signal components such as are encountered in electromagnetic interference (EMI) and engendered in power supply or power converter switching and by digital circuit loads such as microprocessors. Thus, it is desirable to reduce EPC as much as possible, particularly since a small EPC value is generally considered to be a strong indicator of the quality of the inductor element. However, to date, reductions in EPC by control of materials and device geometry and other techniques at the present state of the art are generally limited to about 30%; leaving a significant value of EPC which continues to limit the working frequency of inductors for providing a filter function while requiring arrangements, structures and designs of substantial complexity and criticality.

SUMMARY OF THE INVENTION

It is therefore an object of the present invention to provide a technique for canceling a relatively large portion of the EPC of an inductor to extend the working frequency by a factor of 10-100.

It is another object of the invention to provide an inductor structure which facilitates provision of an inductor structure which may or may not have parasitic capacitance cancellation circuitry included therein which provides an increased inductive coupling between split inductor windings and reduced leakage to improve high frequency performance of the inductor while increasing the degree of cancellation of parasitic capacitance which may be achieved.

In order to accomplish these and other objects of the invention, inductor device and a filter having substantial cancellation of parasitic capacitance is provided comprising an inductor having split windings, each having a parasitic capacitance, and capacitors connected to terminals of the split windings to couple currents passed by one split winding to another of said split windings or an inductor in a ground return path.

BRIEF DESCRIPTION OF THE DRAWINGS

The foregoing and other objects, aspects and advantages will be better understood from the following detailed description of a preferred embodiment of the invention with reference to the drawings, in which:

FIGS. 1C, 1D and 1E illustrate a two-winding inductor on a single toroidal core and an equivalent circuit thereof (FIGS. 1C and 1D indicating currents in differential mode (DM) and common mode (CM), respectively) which will be useful in understanding the invention in all its aspects.

DETAILED DESCRIPTION OF A PREFERRED EMBODIMENT OF THE INVENTION

Figure 1B:
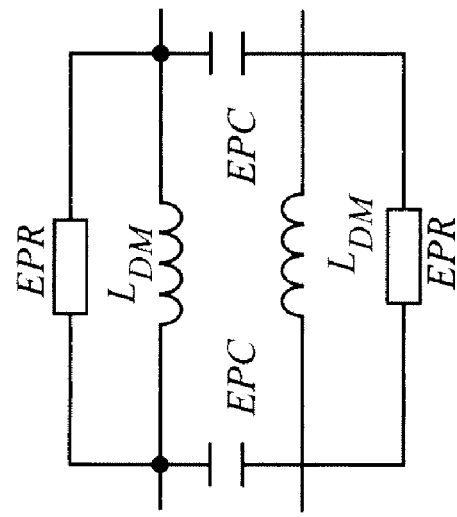
FIGS. 1A and 1B are a circuit schematic diagram and an equivalent circuit thereof, respectively, of the invention as applied to a differential mode (DM) inductor where the inductor windings are not inductively coupled with each other.
Figure 1A:
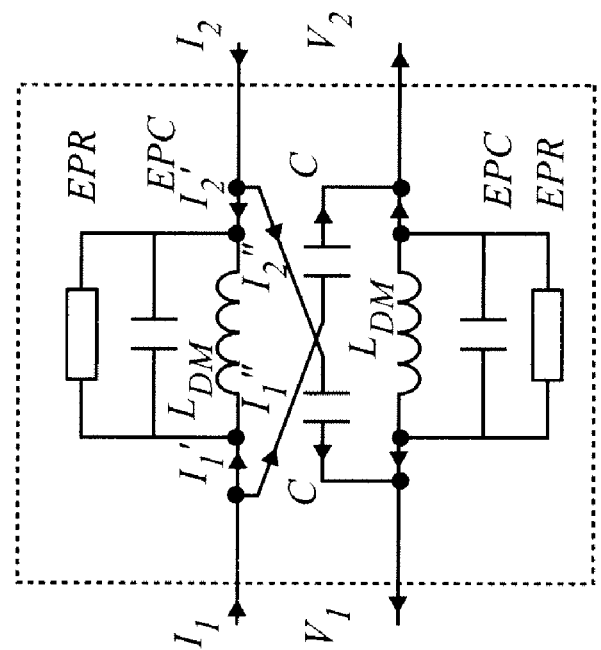

Referring now to the drawings, and more particularly to FIG. 1A, there is shown a schematic circuit diagram including differential mode (DM) inductor windings (which will be further discussed and distinguished from common mode (CM) windings below in connection with FIGS. 1C and 1D) in accordance with the basic principles of the invention and a first preferred embodiment thereof. The two DM inductors illustrated can be two separate components which may or may not be inductively coupled or one integrated component built on, for example, a single core where the windings are necessarily inductively coupled (unless they are the leakage of common mode (CM) inductors). It is assumed that the DM inductors are identical, however they are configured, so that their inductances and parasitic parameters are the same.

Figure 1D:
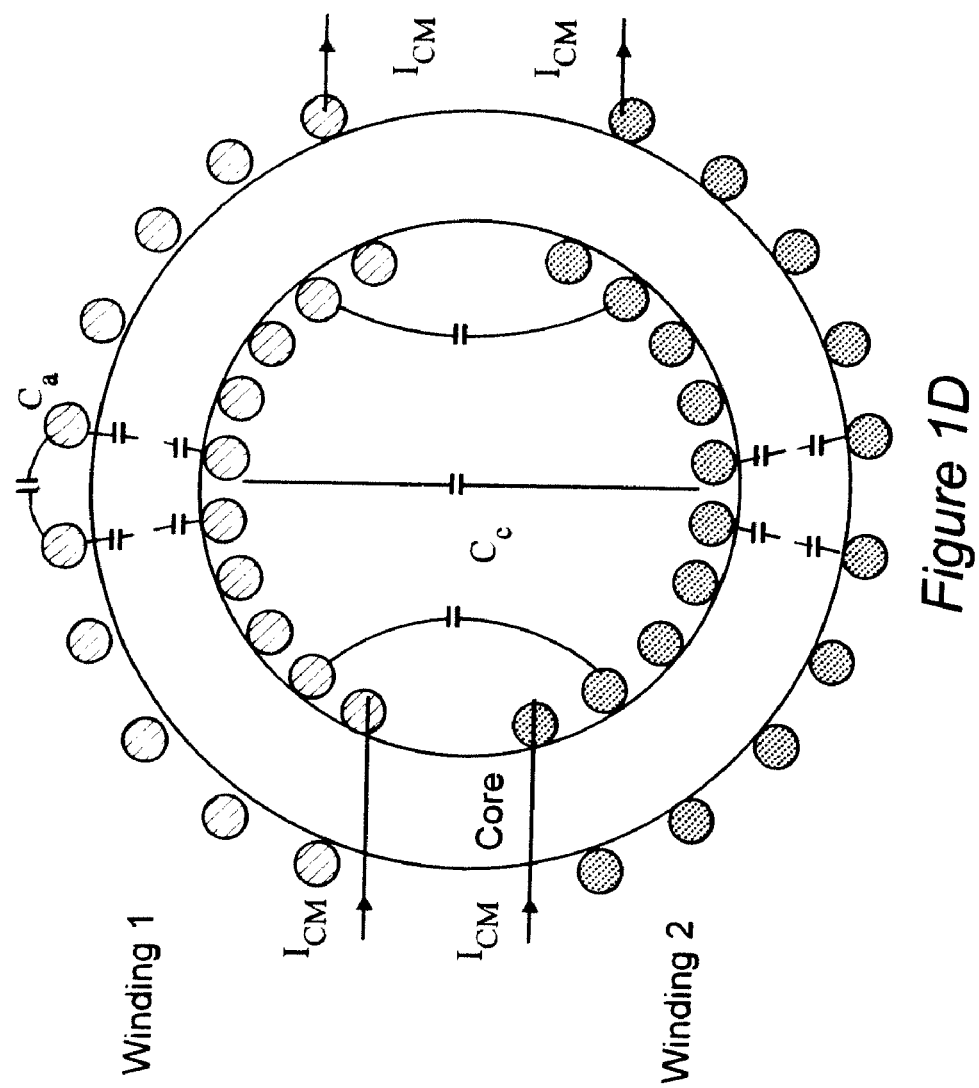

In connection with FIGS. 1C and 1D, as is well-understood in the art, DM and CM inductors are related by the direction of winding on the core relative to current direction in the windings although commonly used nomenclature generally refers to the relative direction of current at the ports. For example, if two windings generate magnetic flux in the same direction (e.g. clockwise in FIG. 1D) with common mode (CM) current, the inductor is referred to as a CM inductor. Conversely, if the two windings generate magnetic flux in the same direction (clockwise in FIG. 1C) with differential mode (DM) current, the inductor is referred to as a DM inductor. Since DM and CM current have been defined as illustrated by arrows in FIGS. 1C and 1D, respectively, the factor determining DM and CM inductors is relative winding direction of the two windings of the split inductor.

FIGS. 1C and 1D also illustrate the three kinds of parasitic capacitance which may be present for two coupled toroidal inductors; a construction which is preferred but not critical for practical implementations of the invention and which can be wound for either differential or common mode operation as is indicated, for clarity, by current direction in the respective windings (e.g. assuming the winding direction to be the same): turn-to-turn capacitance, $C_a$, turn-to-core capacitance, $C_b$, and winding-to-winding capacitance, $C_c$. (While $C_a$, $C_b$ and $C_c$ can be and often are lumped together in the value of EPC, for purposes of understanding the following discussion, only $C_a$ and $C_b$ will be considered as lumped together as EPC since the winding-to-winding capacitance, $C_c$, generally denoted hereinafter as $C_N$, may or may not be presented in a given split winding inductor and, since it generally reduces EPC, is preferably compensated in a somewhat different manner than the lumped parasitic capacitances $C_a$ and $C_b$, as will be discussed below.)

Figure 1E:
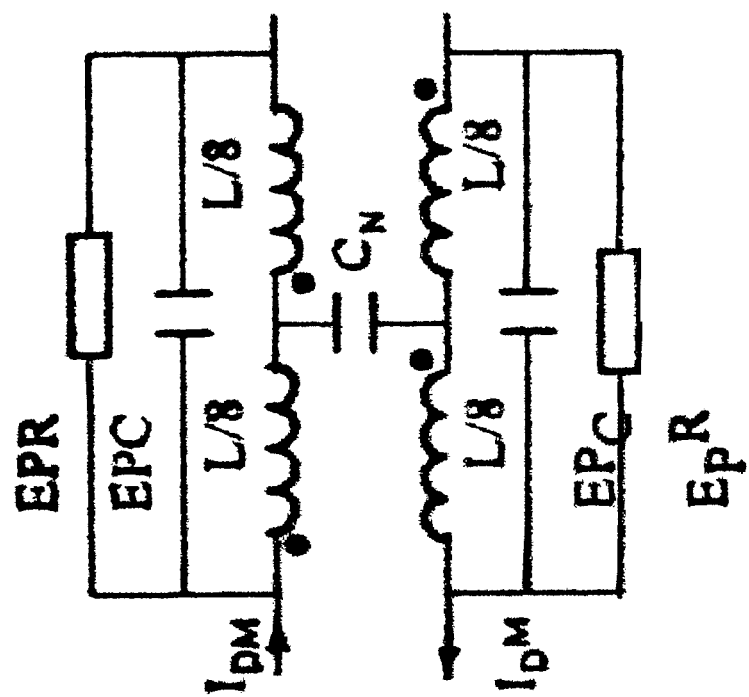

The equivalent circuit of the two toroidal windings of FIG. 1C is shown in FIG. 1E. A detailed analysis of the equivalent circuit of FIG. 1E is provided in "Design of Inductor winding capacitance cancellation for EMI Suppression" by Shuo Wang et al., published in the 37$^{th}$ IEEE Power Electronics Specialists Conference, pp. 2734-2740, Jun. 18-22, 2006, which is hereby fully incorporated by reference.

Specifically, as shown in FIG. 1A, there are two inductors each having an inductance $L_{DM}$ and which are assumed to be not inductively coupled to each other. Since the two inductors are not inductively coupled, it can be assumed that they are not in sufficient proximity to be significantly capacitively coupled and $C_N$ (or $C_c$) which will be discussed below in connection with FIGS. 2A and 2B can be neglected. Each inductor thus includes a parasitic EPC and EPR as illustrated in parallel with the inductor windings. In accordance with the invention, two small capacitors, C, having a capacitance equal to EPC are diagonally connected to the DM inductors. By employing the diagonal connection shown, the high frequency components input to and passed by the EPC of each DM inductor are coupled to the other DM inductor in a manner to provide cancellation of currents and thus effective cancellation of parasitic capacitance. Thus, the equivalent circuit is as illustrated in FIG. 1B which has the same network parameters such as Z-matrices as the circuit of FIG. 1A and thus has the same characteristics on two ports. FIG. 1B also clearly indicates that the resultant network is actually a so-called "pi" (Π) type EMI filter without the effects of the EPC of the respective DM inductors up to extremely high frequencies.

Figures 2A, 2B:
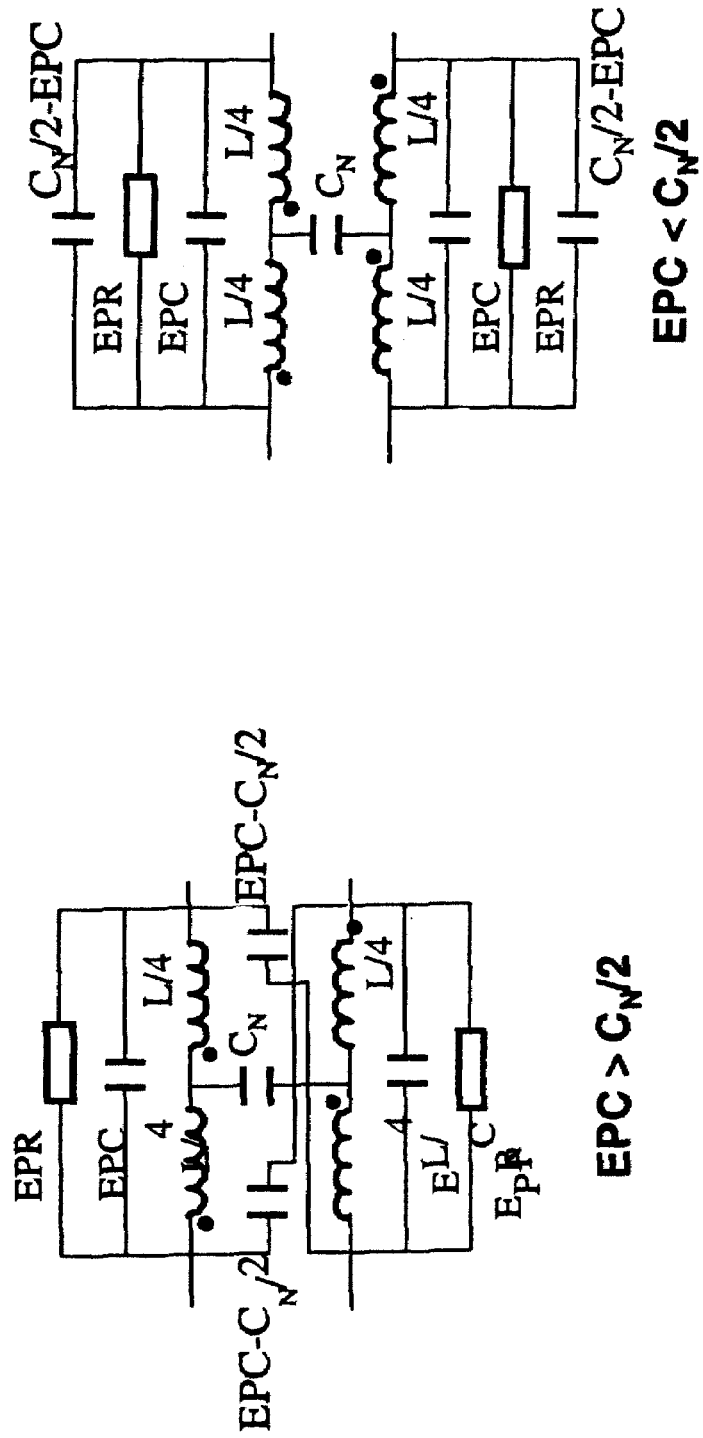
FIGS. 2A and 2B are circuit schematic diagrams corresponding to the EPC cancellation strategy for $EPC > C_N/2$ and $EPC < C_N/2$, respectively.

If, on the other hand, the two DM inductors are inductively coupled with each other, the EPC cancellation in accordance with the invention is somewhat more complicated as will now be discussed with reference to FIGS. 2A and 2B. The complication arises from the fact that there is parasitic capacitance, $C_N$, between the two windings which makes the equivalent winding capacitance equal to the difference between the winding capacitance EPC of one winding and half of the winding capacitance (i.e. $C_N/2$) between the two windings. If the difference is positive, two capacitors with the capacitance value EPC−$C_N/2$ are connected diagonally to the two windings as in the embodiment illustrated in FIG. 1A, discussed above, as specifically illustrated in FIG. 2A. The equivalent circuit formed corresponds to that of FIG. 1B except for the capacitance values which are EPC−$C_N/2$ rather than simply EPC. If the difference is negative, two capacitors each having a capacitance value of $C_N/2$−EPC are connected in parallel with the respective parallel inductor windings as shown in FIG. 2B. That is, while it would appear that additional capacitance in parallel should aggravate the problem of high frequency effects of capacitance in parallel with the inductor, if EPC−$C_N/2$ is negative because $C_N/2$ is greater than EPC, EPC will actually be over-compensated by $C_N$ and, counter-intuitively, positive capacitance of $C_N/2$−EPC parallel to EPC should be added to more closely approximate cancellation because $C_N$ is effectively negative as discussed in detail in the above-incorporated Wang et al. article; requiring additional capacitance in parallel with EPC for more accurate cancellation. It should be noted that where $C_N/2$ is greater than EPC, there is no parallel resonance between the inductor 2L and the capacitance (EPC−($C_N/2$)) since the total parasitic capacitance is negative and thus overcompensates EPC.

Figure 3A:
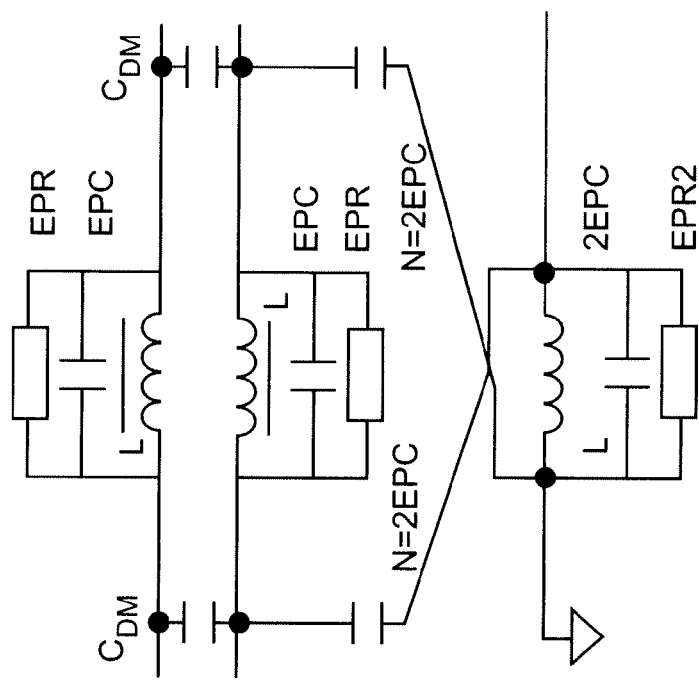
FIGS. 3A and 3B are circuit schematic diagrams of the application of the invention to common mode (CM) inductor windings where an inductor in the ground path is and is not allowed, respectively.

For a common mode (CM) inductor windings (e.g. where the windings of FIG. 1D, or other inductor structure, are wound for common mode conduction), it should be noted that no current will flow in parasitic (discretely depicted) capacitances $C_c$ since both terminals of each winding-to-winding capacitance $C_c$ will see the same voltage since the current at the respective terminals of each port are the same. Thus the winding-to-winding capacitance $C_N$ can be neglected. If an inductor is allowed in the ground path, the same basic principles of the invention described above in regard to FIG. 1A or 2A (depending on whether or not there is inductive coupling between the common mode inductors and the inductor in the ground path) can be employed as illustrated in FIG. 3A. Again, the implementation is very simple and requires only two small capacitors such as ceramic capacitors as in the previously described implementations. Essentially the inductor in the ground path is used as a CM inductor which may or may not be inductively coupled with the CM inductors and capacitance cancellation carried out as described above with cross connections to the inductor in the ground path.

Figure 3B:
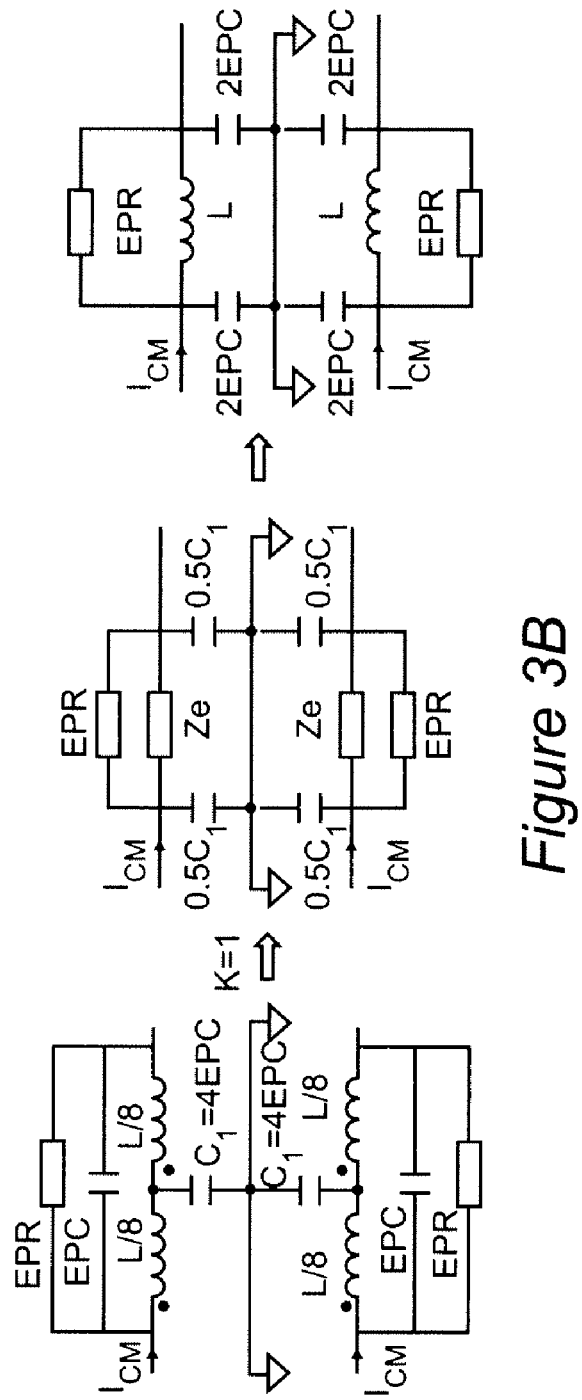

If an inductor is not allowed in the ground path, as is generally the case, a parasitic capacitance reduction (as distinct from cancellation) effect can be achieved by providing a capacitance connection of 4 EPC to the ground path at the center taps of each of the common mode inductors as shown in FIG. 3B. This known approach is discussed in detail in "Improving the Characteristics of Integrated EMI Filters by Embedded Conductive Layers" by R. Chen et al., IEEE Transactions, Power Electronics, Vol. 20, Issue 3; May, 2004; pp. 611-619, which is hereby fully incorporated by reference.

Figure 4:
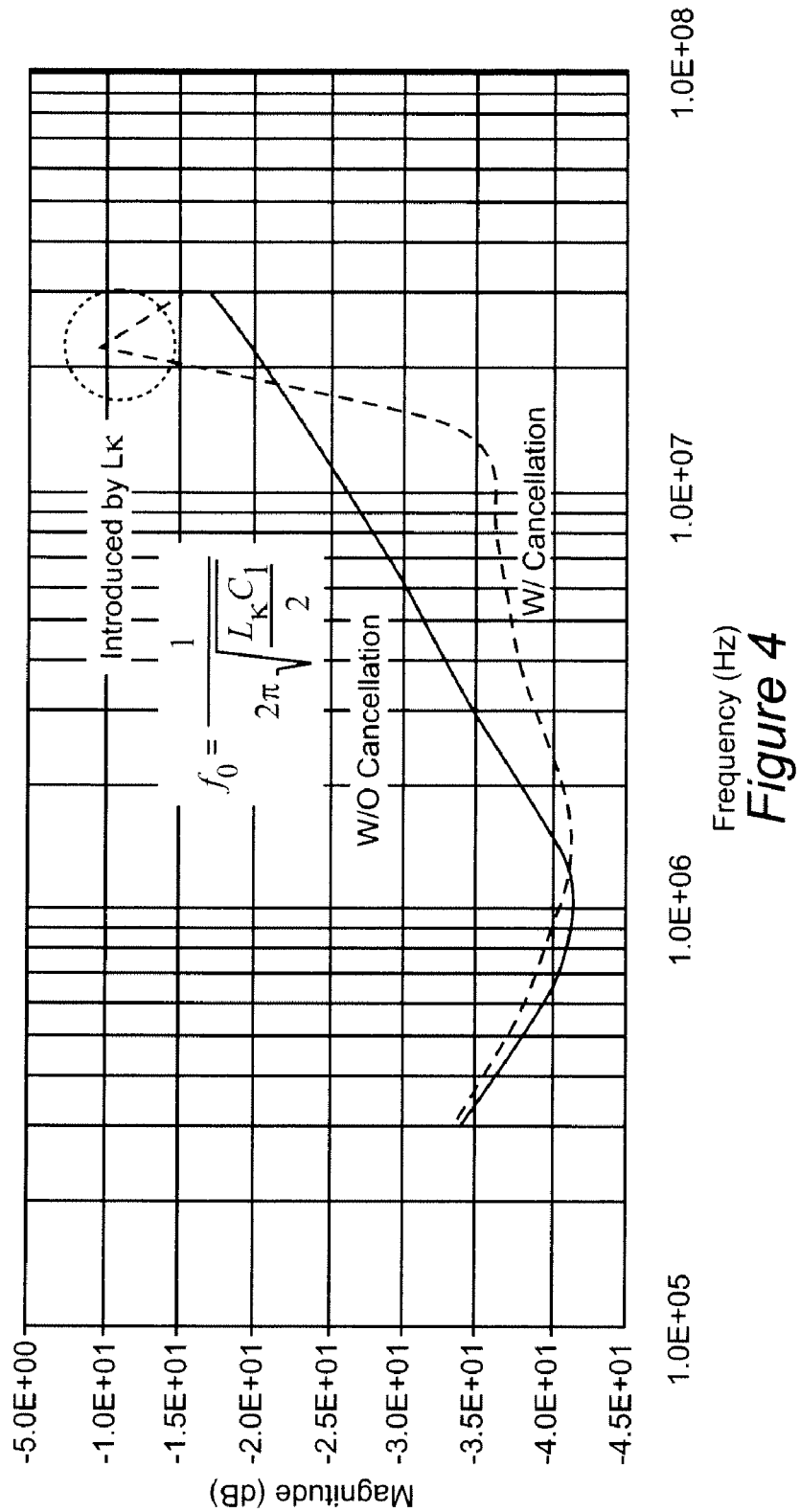
FIG. 4 is a graphical comparison of filtering performance with and without EPC cancellation for CM inductors without an inductor in the ground path in accordance with a known proposed solution for EPC cancellation.

However, this known technique does not provide a complete solution to the EPC problem as illustrated in FIG. 4 since, while it may provide reduction of effects of parasitic capacitance and modestly expand the usable frequency range of an inductor, it does not provide cancellation of parasitic capacitance effects and does not expand the usable frequency range of an inductor to the extent provided by the present invention in accordance with an additional aspect thereof. Specifically, as is evident from FIG. 4, the circuit of FIG. 3B (for an inductance of the two CM windings of about 2.7 mH, EPC of 5.8 pF, EPR of one winding of 15 kΩ, leakage inductance of the two half-windings of 4.24 μH (K=0.994) and cancellation capacitors of 24 pF) improves inductor performance from about 1.25 MHZ to 18.5 MHz. However, from 18.5 MHZ to 30 MHz the performance is significantly worse, with a sharp and significant resonance peak at 25 MHZ.

It has been found by the inventors that this deteriorated performance and resonance peak are due to resonance between the leakage inductance of the two half windings and the added capacitance. Thus parasitic capacitance cannot be considered to be cancelled (e.g. for a broad range of frequencies) by this approach. The large leakage inductance is, in turn, due to the less than optimal coupling coefficient between the CM windings when configured as schematically illustrated in FIG. 1D.

Figure 5:
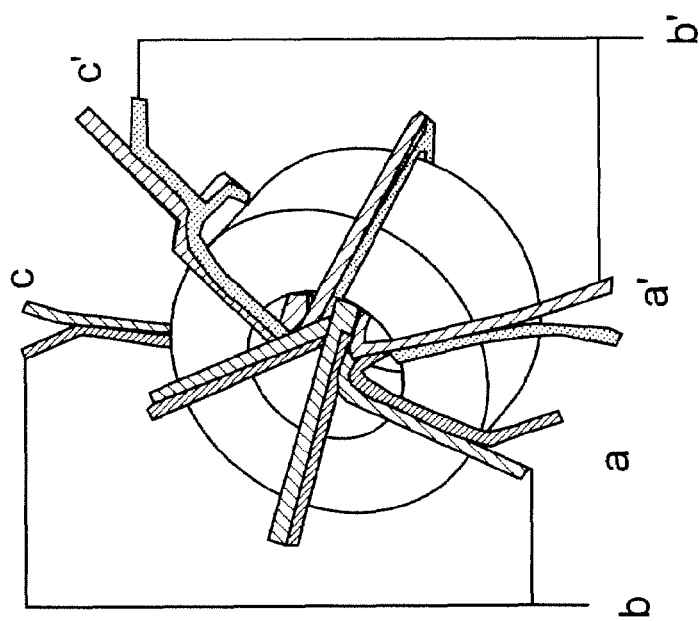
FIG. 5 illustrates a proposed winding strategy to increase the coupling coefficient of two winding halves in accordance with the invention.
Figure 6:
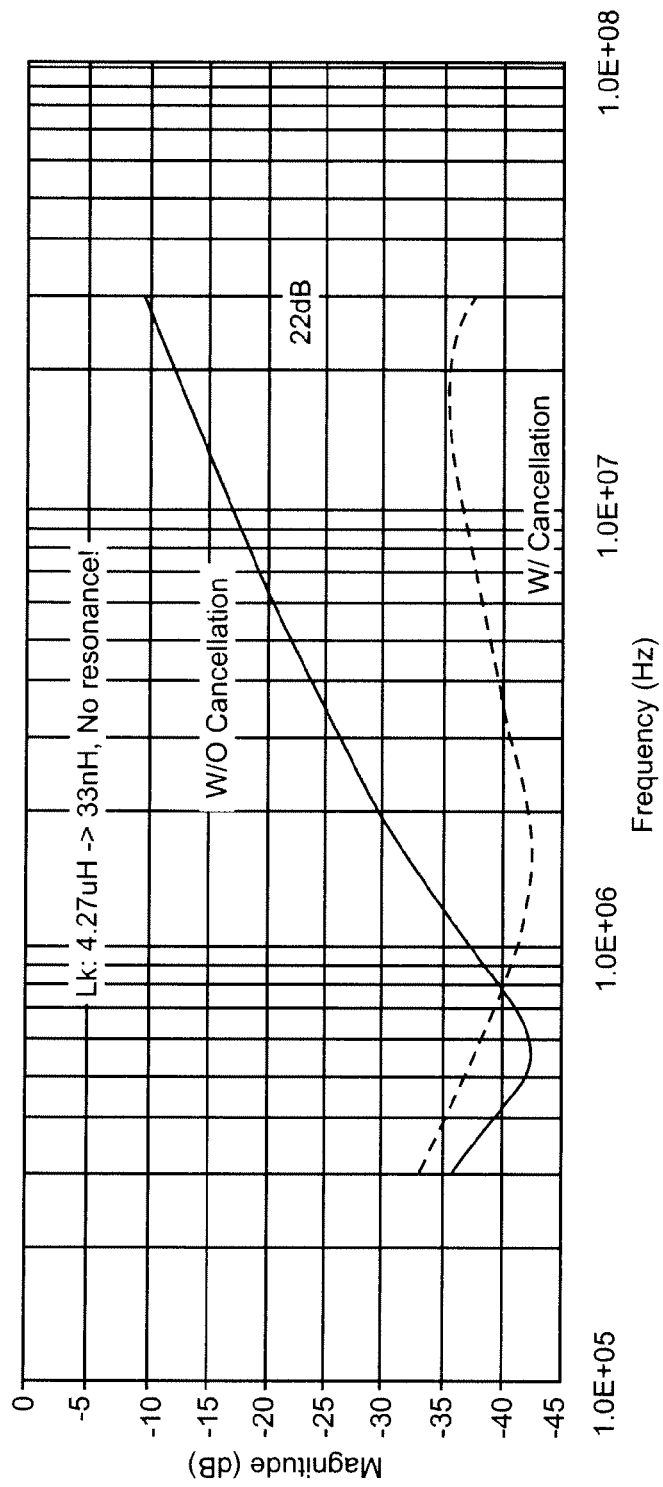
FIG. 6 is a graphical comparison of filter performance with and without EPC cancellation using the inductor winding strategy of FIG. 5.

To improve the coupling coefficient in accordance with the invention, a bifilar winding strategy as illustrated in FIG. 5 is provided. A bifilar winding essentially forms windings with two conductors which are in close proximity at a substantially uniform spacing such as by, for example, attaching them together using an insulating material prior to forming a winding therewith in order to control the small spacing between conductors. Thus, essentially, the bifilar winding provides for the windings of the two common mode coils to be closely spaced such as to be substantially coincident in location and the leakage energy is thus stored only in the very small air gap between the turns of the two windings. By doing so, the measured coupling coefficient is raised from about 0.994 to about 0.99995. Applying the bifilar winding to the approach to the parasitic capacitance reduction circuit illustrated in FIG. 3B results in the greatly improved inductor performance above 800 KHz graphically illustrated in FIG. 6 which provides a 22 db improvement at 30 MHZ compared with the performance of the known technique using conventional toroidal CM windings, as illustrated in FIG. 4 and a 28 db improvement at 30 MHZ over the CM inductor without capacitance cancellation. The bifilar winding strategy of FIG. 5 can also be used advantageously as a perfecting feature in embodiments of the invention using DM windings as described above with reference to FIG. 2A. Experimental results of doing so are discussed in detail in the above-incorporated Wang et al. publication. FIG. 6 also indicates the substantial frequency independence of inductor performance to extremely high frequencies in this particular application but should also be understood to be generally characteristic of the effects of parasitic capacitance cancellation and frequency independence of inductor performance, particularly as an indicator of inductor quality, of other embodiments of the invention as illustrated, for example, in FIGS. 1A-1B and 2A-2B.

In view of the foregoing, it is seen that the invention provides substantial cancellation of effects of parasitic capacitance in inductors which greatly extends the usable frequency range thereof for power converter and EMI filter applications and the like; making the inductor performance substantially frequency independent to extremely high frequencies which is a major indicator of inductor quality. These effects are enhanced in accordance with the invention by a bifilar winding strategy for the preferred split inductor structure which also allows achievement of parasitic capacitance cancellation (as distinct from parasitic capacitance reduction) in accordance with at least a known technique for reducing effects of parasitic inductor capacitance. The usable inductor frequency range is thus increased by a factor of 10-100.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An inductor device having substantial cancellation of turn-to-turn and turn-to core parasitic capacitance and closely approximate cancellation of winding-to-winding parasitic capacitance of an inductor comprising:
   an inductor having split windings, said split windings of said inductor each having a turn-to-turn and turn-to-core parasitic capacitance and said split windings having a winding-to-winding parasitic capacitance, and
   capacitors connected to terminals of said split windings to couple currents passed by said turn-to-turn, turn-to-core and/or winding-to-winding parasitic capacitance of one split winding of said split windings to another of said split windings or an inductor in a ground return path or to compensate for parasitic capacitance which does so.

2. An inductor device as recited in claim 1, wherein said capacitors are cross-coupled between said split windings.

3. An inductor device as recited in claim 1, wherein the split inductor windings are not significantly inductively coupled and wherein a value of said capacitors is substantially equal to the equivalent parallel capacitance of a winding of said split inductor windings.

4. An inductor device as recited in claim 1, wherein the split inductor windings are inductively and capacitively coupled and wherein a value of said capacitors is substantially equal to a difference of the equivalent parallel capacitance of a winding of said split inductor windings and one-half of the winding-to-winding capacitance between said split windings.

5. An inductor device as recited in claim 4, wherein said difference is negative and additional capacitance is provided in parallel with each split inductor winding.

6. An inductor device as recited in claim 1, wherein said split windings comprise bifilar windings.

7. An inductor device as recited in claim 6, wherein said bifilar windings are formed on a toroidal core.

8. An inductor device as recited in claim 1, wherein said split windings are wound as differential mode windings.

9. An inductor device as recited in claim 1, wherein said split windings are wound as common mode windings.

10. An inductor device as recited in claim 9, wherein said split windings comprise leakage inductance of said common mode windings.

11. A filter having substantial cancellation of parasitic capacitance comprising:
   an inductor having split windings, said split windings of said inductor each having turn-to-turn, turn-to-core and turn to winding parasitic capacitances, and
   capacitors connected to terminals of said split windings to couple currents passed by said turn-to-turn, turn-to-core and turn to winding parasitic capacitances of one split winding of said split windings to another of said split windings or an inductor in a ground return path or to compensate for parasitic capacitance which does so.

12. A filter as recited in claim 1, wherein said capacitors are cross-coupled between said split windings.

13. A filter as recited in claim 11, wherein the split inductor windings are not significantly inductively coupled and wherein a value of said capacitors is substantially equal to the equivalent parallel capacitance of a winding of said split inductor windings.

14. A filter as recited in claim 11, wherein the split inductor windings are inductively and capacitively coupled and wherein a value of said capacitors is substantially equal to a difference of the equivalent parallel capacitance of a winding of said split inductor windings and one-half of the winding-to-winding capacitance between said split windings.

15. A filter as recited in claim 14, wherein said difference is negative and additional capacitance is provided in parallel with each split inductor winding.

16. A filter as recited in claim 11, wherein said split windings comprise bifilar windings.

17. A filter as recited in claim 11, wherein said bifilar windings are formed on a toroidal core.

18. A filter as recited in claim 11, wherein said split windings are wound as differential mode windings.

19. A filter as recited in claim 11, wherein said split windings are wound as common mode windings.

20. A filter as recited in claim 19, wherein said split windings comprise leakage inductance of said common mode windings.

* * * * *